United States Patent [19]

Miyachi

[11] Patent Number: 6,080,517
[45] Date of Patent: *Jun. 27, 2000

[54] METHOD OF PROJECTION EXPOSURE

[75] Inventor: Takashi Miyachi, Kounosu, Japan

[73] Assignee: Nikon Corporation, Tokyo, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 09/239,298

[22] Filed: Jan. 29, 1999

Related U.S. Application Data

[60] Continuation of application No. 08/982,587, Dec. 2, 1997, abandoned, which is a division of application No. 08/620,530, Mar. 25, 1996.

[30] Foreign Application Priority Data

Jul. 11, 1995 [JP] Japan ...................... 7-198180

[51] Int. Cl.$^7$ ....................................................... G03F 9/00
[52] U.S. Cl. ................................................ 430/30; 430/22
[58] Field of Search ................................... 355/53, 67, 68, 355/69, 70, 71, 55; 356/399, 400, 401; 250/548, 559.3, 559.37; 430/22, 30

[56] References Cited

U.S. PATENT DOCUMENTS

| | | | |
|---|---|---|---|
| 5,194,893 | 3/1993 | Nishi | 355/53 |
| 5,477,304 | 12/1995 | Nishi | 355/53 |
| 5,502,313 | 3/1996 | Nakamura et al. | 355/53 |
| 5,510,892 | 4/1996 | Mizutani et al. | 356/400 |
| 5,539,497 | 7/1996 | Nishi | 355/53 |
| 5,569,930 | 10/1996 | Imai | 355/53 |
| 5,602,400 | 2/1997 | Kawashima | 250/559.3 |
| 5,654,553 | 8/1997 | Kawakubo et al. | 250/548 |
| 5,659,384 | 8/1997 | Ina | 355/53 |

*Primary Examiner*—Christopher G. Young
*Attorney, Agent, or Firm*—Oliff & Berridge, PLC

[57] ABSTRACT

Disclosed is a projection exposure apparatus which is able to realize stabilized focusing control which presents highly followable performances for the photosensitive substrate with few irregularities and will work without failure even for a photosensitive substrate having rough irregularities. A determining section determines whether the velocity instructions data obtained by a difference between a detected position of the substrate and a target position and a difference between the detected tilt of the substrate and a target tilt falls within respective predetermined allowable ranges. During the affirmative judgment by the determining section, a controller performs focusing and leveling control with high precision. When the determining section makes a negative judgment, the controller effects focusing control with the tilt of the wafer kept at constant.

39 Claims, 7 Drawing Sheets

METHOD OF PROJECTION EXPOSURE

This is a Continuation-in-Part of application Ser. No. 08/982,587 filed Dec. 2, 1997, which in turn is a Divisional of application Ser. No. 08/620,530 filed Mar. 25, 1996. The entire disclosure of the prior application(s) is hereby incorporated by reference herein in its entirety.

BACKGROUND OF THE INVENTION (1) Field of the Invention

The present invention relates to a projection exposure apparatus, and in particular relates to an projection exposure apparatus which is characterized by a controlling method of its focusing system.

(2) Description of the Related Art Conventionally, in the field of the manufacture of semiconductor devices by utilizing the photolithography, projection exposure apparatuses have been used which uses an optical system to produce a pattern image of a mask or reticle on the surface of a photosensitive substrate such as a wafer or glass substrate etc. with a photosensitive material such as a photoresist applied thereon. Since these projection exposure apparatuses typically use a projection optical system with a large numerical aperture (N.A.) and a small depth of focus, the apparatus needs to have a mechanism of bringing the wafer surface into a focal plane of the projection optical system in order to transfer a minute circuit pattern with high resolution. Therefore, the projection exposure apparatus has a focusing system for bringing the photosensitive substrate surface into a range of the depth of focus of the projection optical system. This focusing system is composed of a focus/leveling detecting part for detecting the position and inclination of the photosensitive substrate surface with respect to the optical-axis direction (Z-direction) of the projection optical system and an adjusting mechanism (to be referred to hereinbelow as a ZT-stage) for adjusting the position and posture of the photosensitive substrate surface based on the detected height and inclination.

Conventionally, so-called step-and-repeat type projection exposure apparatuses have been used mainly in the field. On the other hand, one chip of a semiconductor device tends to be made large-scale, this demands that a greater pattern should be projected on the wafer for exposure. To meet this demand, a projection exposure apparatus of step-and-scan type has been devised which scans the reticle and wafer in synchronism relative to the projection optical system, thus making it possible to effect an exposure of a greater range of the shot area than that of the valid exposure field formed by the projection optical system. In the step-and-scan exposure apparatuses, a pattern on the reticle is illuminated as a slit-shaped area by a light beam which is defined by blinds in illuminating system. The illuminated area on the reticle pattern is termed 'illumination field'. On the other hand, the illuminated field on the wafer, that is, a field formed on the wafer in conjugate with the illumination field through the projection optical system is termed 'exposure field'. The exposure field is also slit-shaped in the step-and-scan exposure apparatus. In contrast to these terms, a large area on the wafer (photosensitive substrate) into which the whole pattern image on the reticle is projected successively is called as 'exposure area'.

In the thus described projection exposure apparatus of step-and-scan type, it is necessary to move both the photosensitive substrate and the reticle in synchronism with each other as to their positions, at a substantially constant velocity which is in conformity with the energy amount to be given, in order to expose a certain area of the photosensitive substrate surface with the pattern of the reticle. To achieve this, a stage (XY-stage) with the photosensitive substrate mounted thereon is started to run from the position prior to the region where exposure is to be made (an approach run), so as to be synchronized with a reticle stage with the reticle mounted thereon during the approach run. Thereafter, when the area to be exposed on the photosensitive substrate reaches the exposure position, exposure will be made. As to the focusing operation, a search of the focal position during the approach run and a shift of the photosensitive surface to the focal position, are also effected as a part of the above procedures. Then, the focusing operation is carried out by following the surface of the moving photosensitive substrate. Typically, in this focusing operation, a focusing action with respect to the optical-axis (Z-axis) direction of the projection optical system is carried out simultaneously with a focusing action of adjusting tilt with respect to X- and Y-axes (leveling operation), in order to minimize the difference between the exposure field of the photosensitive substrate surface and the focal plane of the projection optical system.

In the projection exposure apparatus of step-and-scan type, because the photosensitive substrate to be exposed moves during exposure, adjustment of the photosensitive substrate surface in the exposure field to the focal plane of the projection optically system is successively and repeatedly made. Further, as compared to the projection exposure apparatuses of en-block exposure type such as a stepper, the illuminated area field is narrow therefore it is necessary to drive the ZT-stage at a greater velocity if the above successive adjustment is to be made.

Now, explanation will be made on the driving velocity of the ZT-stage by considering a case in which a surface evenness of the photosensitive substrate is relatively large, for example, in which the photosensitive substrate is scanned in an exposure field (the illuminated area of the substrate) of 8 mm in width in the scan direction and the height difference of the surface in this distance is assumed to be 0.5 $\mu$m. In this case, while the substrate is scanned for 8 mm, the surface moves up or down by 0.5 $\mu$m with respect to the height direction (z-direction), this can be represented by a tilt angle of 0.5 $\mu$m/8 mm=about 62 $\mu$rad. Here, if the scan velocity of the photosensitive substrate is 80 mm/sec, the photosensitive substrate passes through the exposure field for 0.2 sec. Accordingly, the leveling operation must be done at a rate of 62 $\mu$rad/0.1 sec=620 $\mu$rad/sec. The equivalent distance between driving pivots of the ZT-stage for effecting the leveling operation is about 250 mm at maximum for an 8 inch wafer stage, therefore the driving speed in the Z-direction at the pivot positions is about 250 mm×620 $\mu$rad/sec=155 $\mu$pm/sec. On the other hand, the control quantity of the focusing control in the z-direction should adequately be estimated within about 0.5 $\mu$m/0.1 sec=5 $\mu$m/sec. Therefore, the ratio of the control quantities between the leveling and focusing operations is about 30:1.

This ratio constrains the relation between the resolution of velocity instructions and the maximum velocity in the velocity control system within a certain range. To give velocity instructions to a velocity control system of analog control, a 12 bit D/A converter is often used. In this case, the ratio between the resolution of the velocity instruction value and the maximum value of the velocity instruction value is 1:2048Usually, the system is designed so that the velocity instruction value will be equal to a product obtained by the multiplication of the resolution of a focus detecting system and a servo gain of a position servo system. Accordingly, for example, if the resolution of the focus detecting system and the gain are 0.01 µm and 10 (1/sec), respectively, the resolution of the velocity instruction value is 0.1 µm/sec and the maximum value of the velocity instruction value is about 205 µm/sec.

In the case of the above condition, if a photosensitive substrate having irregularities of over 80 µrad (0.64 µm/8 mm) is processed, the driving speed in the Z-direction at the pivot reaches the limit of the system, and therefore the interdependence-freeing control which is based on the premise of linear control will break down. As a result, the conventional system suffered from defocus not only in the tilt direction but also in Z-direction, due to the failure of the linear control and this defects would disordered the image focusing.

SUMMARY OF THE INVENTION

The present invention has been achieved in view of what has been discussed above and it is therefore an object of the invention to provide a projection exposure apparatus which is able to achieve stabilized focusing control which presents highly followable performances for the photosensitive substrate with few irregularities and will work without failure even for a photosensitive substrate having rough irregularities.

A projection exposure apparatus of a first feature of the invention exposes a pattern formed on a mask (R) to the surface of a photosensitive substrate placed on a substrate table (10) by illuminating the mask to project part of the pattern image (1) of the mask onto an exposure field (6) of the photosensitive substrate through a projection optical system (PL) as scanning the mask and the substrate in synchronism with each other relative to the projection optical system. The projection exposure apparatus includes: a first detecting circuit (7, 27) for detecting a first position (z) of the exposure field (6) on the photosensitive substrate surface in a direction of an optical axis of the projection optical system and detecting a first tilt data (θx, θy) of the exposure field relative to a plane perpendicular to the optical axis; an adjusting circuit (60) for adjusting the position of the substrate table in the optical-axis direction and the tilt of the substrate table with respect to a plane perpendicular to the optical axis; a second detecting circuit (21B-23B) for detecting a second tilt data (Θx, Θy) of the substrate table relative to a plane perpendicular to the optical axis; a target data-outputting circuit (25) for outputting a target position (z') of the exposure field on the photosensitive substrate in the optical-axis direction and target tilt data (θx', θy', Θx', Θy', z') relative to a plane perpendicular to the optical axis; a controlling circuit (29, 31) for controlling the adjusting circuit based on either the first tilt data or the second tilt data, the target position and the target tilt data, the first position; and a switching circuit (28, 32) for selecting either the first tilt data or the second tilt data based on the first position, the first tilt data, the target position and the target tilt data.

In accordance with the invention, when the substrate table is scanned for exposure, optical-axis directional positions of at least three points inside the exposure field on the photosensitive substrate surface are detected by the first detecting circuit, for example. Based on the detection, the Z-directional position of the exposure field on the photosensitive surface and the tilt of the exposure field relative to the perpendicular plane to the optical axis are calculated based on, for example, the least-square approximating method. The target data-outputting circuit produces target data, specifically, a center position of the exposure-field on the photosensitive substrate surface in the optical-axis direction and a target tilt of the exposure field. The determining circuit determines whether the deviation of the tilt with respect to either X- or Y-direction, falls within a predetermined allowable range based on the target data outputted from the target data-outputting circuit, the Z-directional position and the tilt angle of the photosensitive substrate. Here, if the photosensitive substrate surface has few irregularities, the deviation of the tilt will fall within the allowable range. In this case, the determining circuit will make an affirmative judgment. In contrast, if the photosensitive substrate surface is vary rough, the deviation of the tilt will fall beyond the allowable range. In this case the determining circuit will make a negative judgment.

While the determining section is making affirmative judgment or an area on the photosensitive substrate surface with few irregularities is placed in the exposure field, the control circuit controls the adjusting circuit so that the exposure field on the photosensitive substrate surface is made to correspond with the focal plane of the projection optical system based on the target data from the target data-outputting section and the calculation result from the calculating circuit. Thus, the position of the photosensitive substrate surface in the optical-axis direction and the tilt with respect to the optical axis direction are adjusted by the adjusting circuit, whereby high-precision forcing and leveling controls are done.

On the other hand, while the determining section is making negative judgment, or an area on the photosensitive substrate surface with sharp irregularities is placed in the exposure field, the position of the exposure field on the photosensitive substrate surface in the optical-axis direction is made to correspond with the center position of the focal plane of the projection optical system in the optical-axis direction based on target data as to the center position of the exposure field in the optical-axis direction and outputted from the target data-outputting circuit, with the photosensitive substrate surface being kept at a fixed tilt. Thus, focusing control for bringing the photosensitive substrate surface into focus is performed. In this case, since the tilt of the photosensitive substrate surface is kept fixed, it is possible to realize stabilized focusing operation free from operation failure.

A projection exposure apparatus of a second feature of the invention includes: a first detecting circuit (7, 27) for detecting a first position (z) of the exposure field (6) on the photosensitive substrate surface in a direction of an optical axis of the projection optical system and detecting a first tilt data (θx, θy) of the exposure field relative to a plane perpendicular to the optical axis; an adjusting section (21A-23A) for adjusting the position of the substrate table with respect to the optical-axis direction and the tilt of the substrate table with respect to a plane perpendicular to the optical axis; a second detecting section (21B-23B) for detecting a second tilt data (Θx, Θy) of the substrate table relative to a plane perpendicular to the optical axis; a target data-outputting section (25) for outputting a target position (z') of the exposure field on the photosensitive substrate in the optical-axis direction and target tilt data (θx', θy', Θx', Θy', z') of the exposure field relative to a plane perpendicular to the optical axis; a controlling section (29, 31) for controlling the adjusting section based on either the first tilt data or the second tilt data, the target position and the target tilt data, the first position; and a switching section (28, 32) for selecting either the first tilt data or the second tilt data based on the first position, the first tilt data, the target position and the target tilt data.

In this case, when the determination by the determining circuit is changed from the affirmative to the negative, the control circuit and adjusting circuit start the focusing and leveling controls.

In the determining circuit, it is also possible to determine the operation state as to be any one of the following three cases:

1) Deviations of the tilt with respect to first and second (X and Y) axes both fall within an allowable range;
2) Deviations of the tilt with respect to first and second (X and Y) axes both fall beyond the allowable range; and
3) Other than the above cases, that is, Either of deviation of the tilt with respect to first or second (X or Y) axis falls beyond the allowable range.

In the above case 1), the control circuit sets up the first control mode in which the adjusting circuit is controlled based on the target data from the target data-outputting circuit and the calculation result from the calculating circuit. With this setup, the adjusting circuit adjusts the position of the photosensitive substrate surface with respect to the optical-axis direction and the inclination with respect to the optical-axis direction, so that high-precision focusing and leveling controls are effected.

In the above case 2), the control circuit sets up the second control mode in which the adjusting circuit is controlled so that with the photosensitive substrate surface kept at a fixed tilt, the position of the exposure field on the photosensitive substrate surface in the optical-axis direction is made to correspond with the center position of the focal plane of the projection optical system in the optical-axis direction based on target data outputted from the target data-outputting circuit as to the center position of the exposure field with respect to the optical-axis direction. With this setup, the adjusting circuit adjusts the position of the photosensitive substrate surface. In this case, since the tilt of the photosensitive substrate is maintained at fixed position, it is possible to effect stabilized focusing operation control without failure.

Further, in the above case 3), the control circuit sets up the third control mode in which the adjusting circuit is controlled so that with the tilt with respect to either the first or second axis kept constant, the position of the exposure field on the photosensitive substrate surface in the optical-axis direction and the tilt with respect to the remaining axis are controlled based on the target data from the target data-outputting circuit and the tilt data detected by the second detecting circuit. With this setup, the adjusting circuit effect focusing control of the photosensitive substrate surface as well as leveling control of the substrate with respect to the remaining axis. In this case, since the tilt with respect to one of the two axis is kept constant, the control will work without failure.

It is also possible to set up the system in such a manner that, the operation may be set into the first control mode so that the focusing and leveling control can be started as soon as it is judged that tilt deviations with respect to both the axes fall within the limited range in the course of the operation in the second or third mode.

It is also possible to set up second target data as to the tilt derivations much smaller than the actual tilt deviations. In such a case, it is also possible to make leveling control with respect to the axis free from control failure. In this case, it is preferable that the second target data is varied in accordance with what degree the tilt deviations fluctuate beyond the specified allowable range.

DESCRIPTION OF THE PREFERRED EMBODIMENTS

One embodiment of the invention will hereinafter be described with reference to FIGS. 1 to 5.

Figure 1:
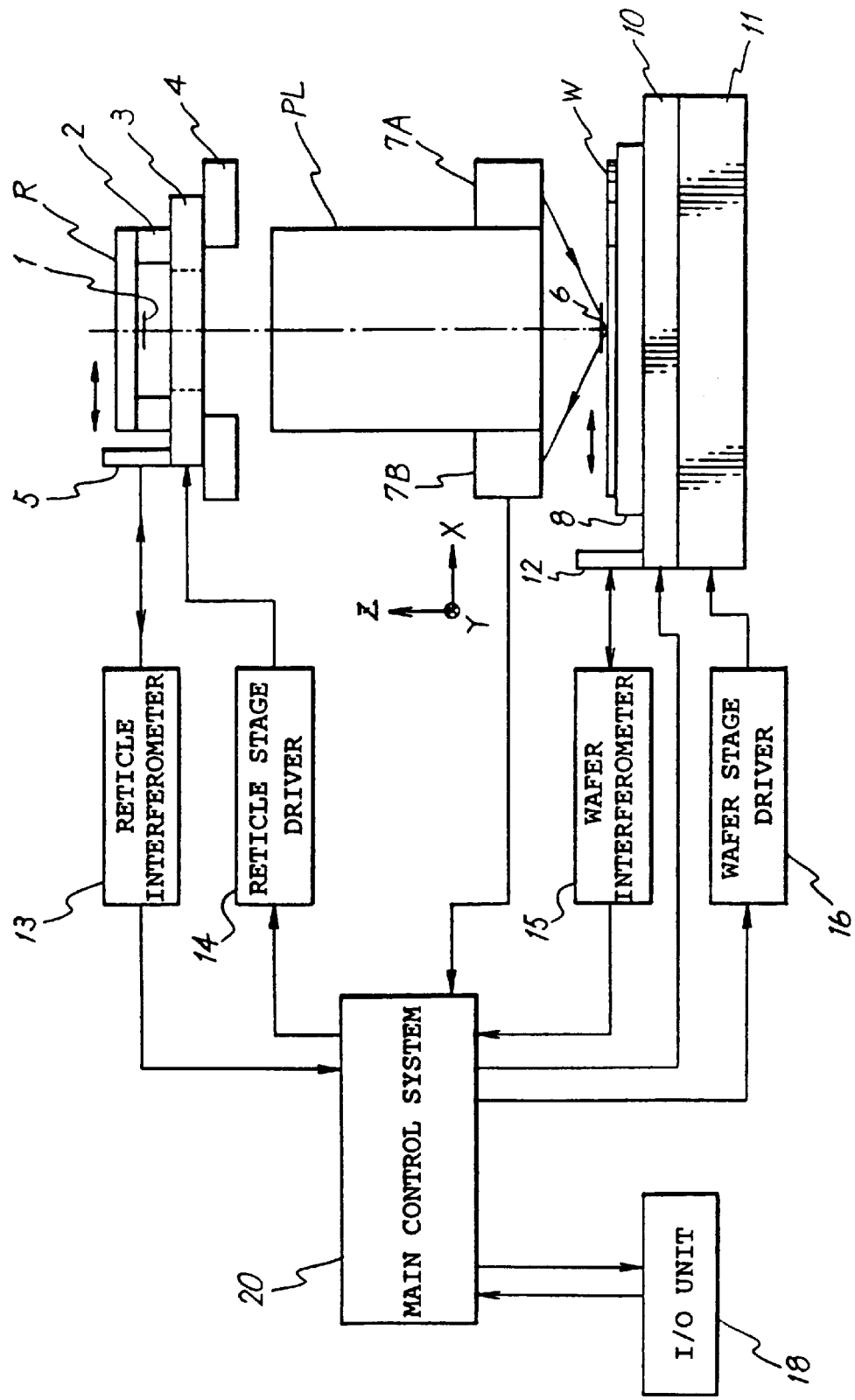
FIG. 1 is a diagram showing an overall configuration of a projection exposure apparatus of step-and-scan type in accordance with an embodiment of the invention.

FIG. 1 shows an overall configuration of a projection exposure apparatus of step-and-scan type in accordance with one embodiment of the invention.

In FIG. 1, a reticle R as a mask is placed on a reticle stage 3 via a reticle holder 2. This reticle stage 3 is driven in the scanning direction (X-direction in FIG. 1) along a guide face of a reticle stage guide 4 by a reticle stage driver 14. A moving mirror 5 is provided in one end with respect to the scanning direction on the reticle stage 3 so that the length of the mirror 5 is extended in the direction (Y-direction) perpendicular to the document. Disposed opposite to the moving mirror 5 is a reticle interferometer 13 which emits laser beams to the moving mirror 5 and receives the reflected light to measure the position of the reticle stage 3. The measurement obtained by the reticle interferometer 13 is supplied to a main control system 20 which, based on the measurement of the reticle interferometer 13, controls the position and velocity of the reticle stage 3 through the reticle stage driver 14.

A moving mirror (not shown) extending in X-direction for detecting the deviation with respect to Y-direction is disposed on the reticle stage 3 and an unillustrated reticle interferometer is provided for the moving mirror.

An illumination field 1 on the reticle R is illuminated substantially uniformly by illuminating light from an illumination optical system unillustrated, whereby a projection image of the reticle is formed through a projection optical system PL in an exposure field 6 on a wafer W as a photosensitive substrate.

Figure 2:
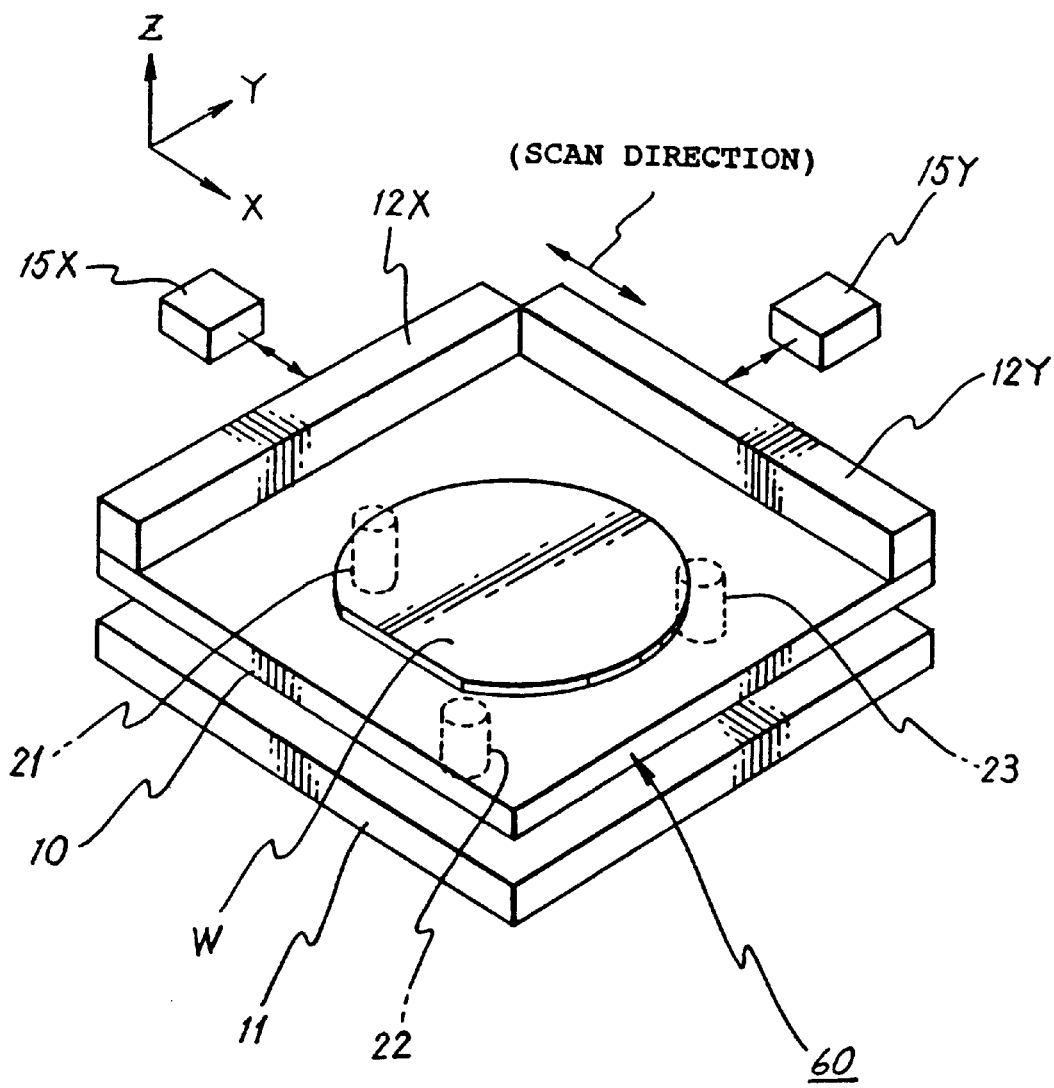
FIG. 2 is a perspective view showing in detail, a substrate table and its driver device shown in FIG. 1.

The wafer W is suction clamped on a wafer holder 8 by means of an unillustrated vacuum chuck. The wafer holder 8 is placed on a substrate table 10. This substrate table 10 is supported, as shown in FIG. 2, at three points through three Z-positional drivers 21, 22 and 23 on an X-Y stage 11. Each of these three Z-positional drivers 21, 22 and 23 is composed of two parts: the lower half is an actuator 21A, 22A or 23A for driving the Z-positional driver supporting point abutting the undersurface of the substrate table 10 along the direction (Z-direction) of the optical axis of the projection optical system PL; and the upper half is an encoder 21B, 22B or 23B for detecting the position of each of the Z-positional driver with respect to the Z-direction (see FIG. 5). That is, in this embodiment, the substrate table 10, the three actuators 21A, 22A and 23A constitute a Z-tilt stage 60 adjusting the point of the wafer W surface with respect to the optical-axis direction (the Z-directional position) and the inclination of the wafer surface relative to a plane perpendicular to the optical axis.

Now, a configurational example of the actuators 21A to 23A will be explained.

Figure 6:
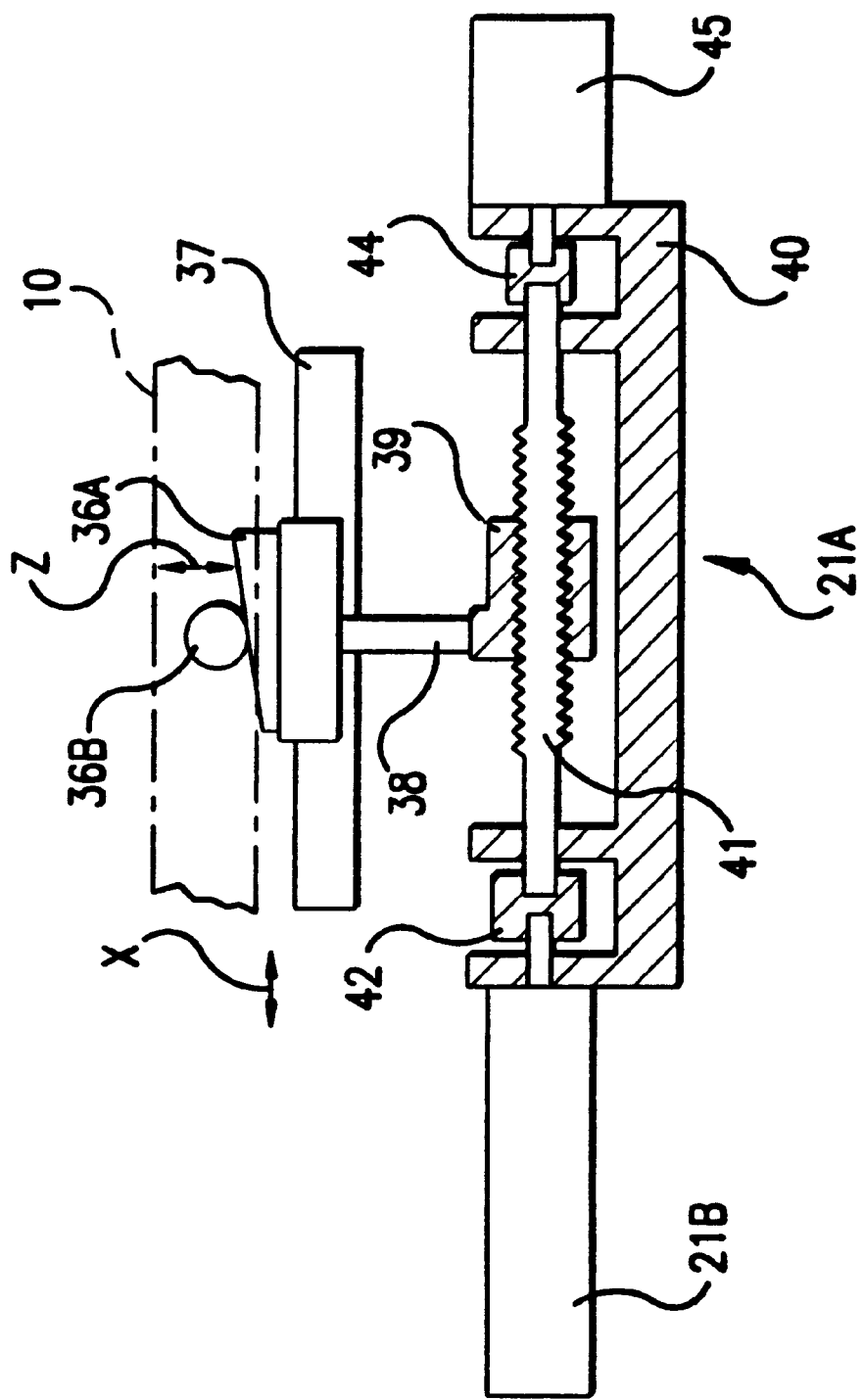
FIG. 6 is a diagram showing a configuration of an actuator.

FIG. 6 is a sectional view of the actuator 21A. In FIG. 6, a driving device housing 40 is affixed on the X-Y stage 11. Rotatably incorporated in the driving device housing 40 is a feed screw 41. A rotary encoder 21B for rotary angle detection is connected at the left end of the feed screw 41 via a coupling 42 while the right end of the feed screw 41 is connected to a rotary motor 45 via a coupling 44. Fitted on the feed screw 41 is a nut 39 to which a slant section 36A having a slant face on the top is fixed via a supporting column 38. A rotary body 36B is disposed in contact with the top face of the slant section 36A. The rotary body 36B is set inside the substrate table 10 of FIG. 1, rotatably but immovably with respect to the lateral direction.

The slant section 36A is supported so as to be movable along a linear guide 37 in parallel to the feed screw 41. In this case, a control signal instructing the driving rate is supplied to the rotary motor 45 from a controller 31 shown in FIG. 5 so that the rotary motor 45 rotates the feed screw 41 at the driving rate (angular rate) instructed. This causes the nut 39 to move along the feed screw 41 in X-direction and therefore the slant section 36A moves along the feed screw 41. Accordingly, the rotary body 36B in contact with the top face of the slant section 36A moves as rotating in the vertical direction (Z-direction) relative to the driving device housing 40. The rotary encoder 21B measures the rotational angular rate of the feed screw 41, whereby the moving velocity of the rotary body 36B in the vertical direction is detected. The other actuators 22A and 23A have the same configuration and the other encoders 22B and 23B have the same configuration.

The actuators 21A to 23A may be configurated using, for instance, laminate type piezoelectric devices etc., in place of the rotary motor used above as shown in FIG. 6. As in such a case where linearly moving driving elements are used for the actuators 21A to 23A, a linear encoder such as of an optical type, electrostatic capacitance type, or the like can be used for detecting the Z-directional position.

The X-Y stage 11 with the substrate table 10 mounted thereon is driven in the directions of X- and Y-axes by means of a wafer stage driver 16. Thus, the wafer W is adapted to be shifted in the Y-axis direction and scanned in the X-axis direction. Provided on one end with respect to the X-direction on the substrate table 10 is a moving mirror 12X extending along the Y-direction, as shown in FIG. 2. An X-axis directional wafer-interferometer 15X is disposed opposite to the moving mirror 12X. Similarly, another moving mirror 12Y extending along the X-direction is provided on one end in the Y-direction on the substrate table 10 and a corresponding Y-axis directional wafer-interferometer 15Y is disposed opposite to the moving mirror 12Y. These wafer interferometers 15X and 15Y are adapted to measure the two-dimensional, or X and Y directional positions of the substrate table 10. In FIG. 1, a moving mirror 12 is shown as a representative of the moving mirrors 12X and 12Y while a wafer interferometer 15 is shown as a representative of the wafer interferometers 15X and 15Y. The measurement from the wafer interferometer 15 is supplied to the main control system 20, which controls the position and velocity of the X-Y stage 11 by means of the wafer-stage driver 16 based on the measurement thus inputted. Upon the scanning for exposure, the main control system 20 controls the reticle stage 3 and the X-Y stage 11 in synchronism.

Figure 3A:
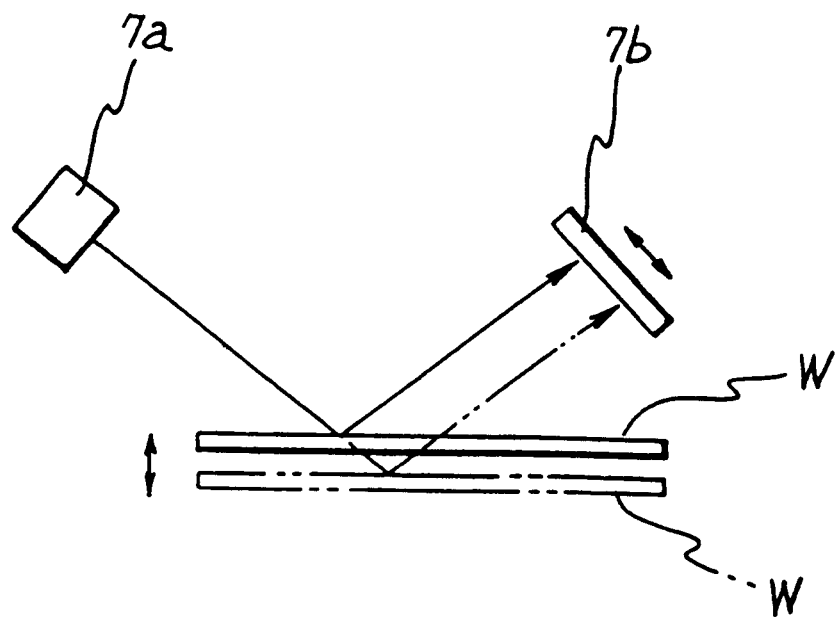
FIG. 3A is an illustration showing the detecting principle of a focus sensor.
Figure 3B:
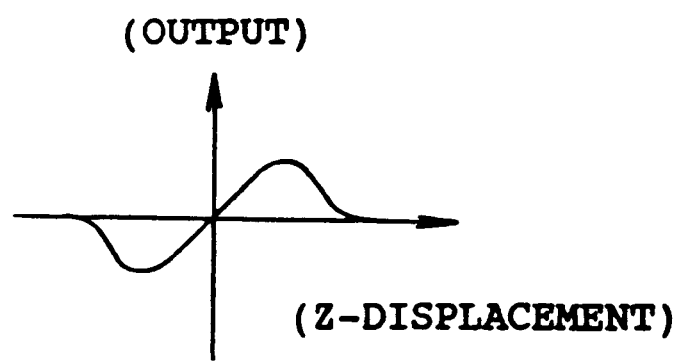
FIG. 3B is an output chart depending on Z-directional displacement.
Figure 4:
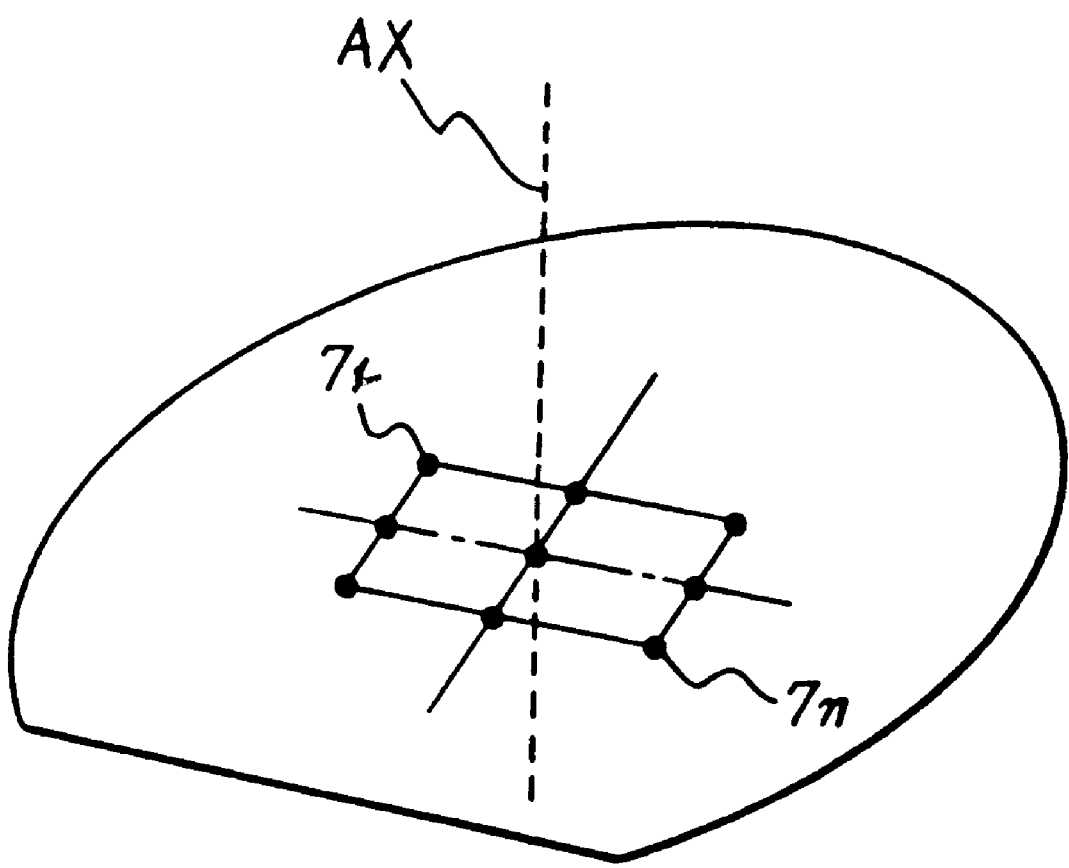
FIG. 4 is an illustration showing an arrangement of sensor elements constituting a focus sensor.

The position on the wafer W surface with respect to the Z-direction is photoelectrically detected by means of a focus sensor (to be referred to generically as 'focus sensor 7' for convenience) made up of a light emitting side 7A and light-receiving side 7B. FIG. 3 shows the principle of detecting by the focus sensor 7. As shown in FIG. 3A, a light beam emitted from the light emitting circuit (device) 7a and reflected on the wafer W surface is made incident on the light-receiving surface of a light-receiving circuit (device) 7b. The position on the light-receiving surface on which the reflected light is incident varies depending on the position of the wafer W surface with respect to the direction of the Z-axis. In response to the Z-directional position, a sigmoid-curve signal as shown in FIG. 3B is outputted from the light-receiving circuit 7b. Therefore, the position of the wafer W surface with respect to Z-direction is photoelectrically detected based on the sigmoid-curve signal. In this embodiment, as shown in FIG. 4, the focus sensor 7 is composed of sensor elements $7_1$ to $7_n$, which are two-dimensionally arrayed in the exposure field 6 over the wafer W around an optical axis AX of the projection optical system PL as their center. Since the plural sensor elements $7_1$ to $7_n$ detect plural positions with respect to Z-direction, the tilt angle (θx, θy) of the wafer W surface (strictly speaking, of the exposure field 6) can be known by applying the least-square calculation using the data on the plural Z-directional positions.

Although in the above embodiment, a plurality of sensor elements $7_1$ to $7_n$ are used to detect the tilt angle and the focal position of the exposure field 6 on the wafer W, an AF sensor for measuring a single point may be used in place of the plural sensor elements. In this case, a leveling sensor of slantingly incident parallel-light flux type is used in which the tilt angle of the wafer W surface is detected by illuminating parallel light flux slantingly onto the wafer W surface and analyzing the lateral deviation of the focal position of the reflected light from the wafer surface.

In FIG. 1, the main control system 20, based on the measurement by the focus sensor 7, controls the Z-tilt stage 60 (more specifically, the actuators 21A, 22A and 23A) driving the substrate table 10) to thereby control the position of the wafer W surface.

As stated, the supporting points abutting the substrate table 10, are driven by means of the aforementioned actuators 21A, 22A and 23A and the positions of the supporting points with respect to the Z-direction are measured respectively by the encoders 21B, 22B and 23B built in respective Z-positional drivers 21, 22 and 23. Based on these measurements, namely, PZ1, PZ2 and PZ3, X-Y two-dimensional coordinate points (X1, Y1), (X2, Y2) and (X3, Y3) of respective Z-position drivers 21, 22 and 23, the position of the substrate table 10 may be defined as the following formula 1:

$$\begin{bmatrix} \Theta x \\ \Theta y \\ Z \end{bmatrix} = \begin{bmatrix} X1 & Y1 & 1 \\ X2 & Y2 & 1 \\ X3 & Y3 & 1 \end{bmatrix}^{-1} \begin{bmatrix} PZ1 \\ PZ2 \\ PZ3 \end{bmatrix}$$

... (formula 1)
where,
   Θx : X-directional tilt
     (tilt with respect to the Y-axis)
   Θy : Y-directional tilt
     (tilt with respect to the X-axis)
   Z : Z-directional position.

The coordinate system on the wafer W surface obtained by the focus sensor 7 and the coordinate system of positions on the substrate table 10 obtained by the encoders 21B, 22B and 23B are made correspondent as to their origins and scales by previous calibrations.

Figure 5:
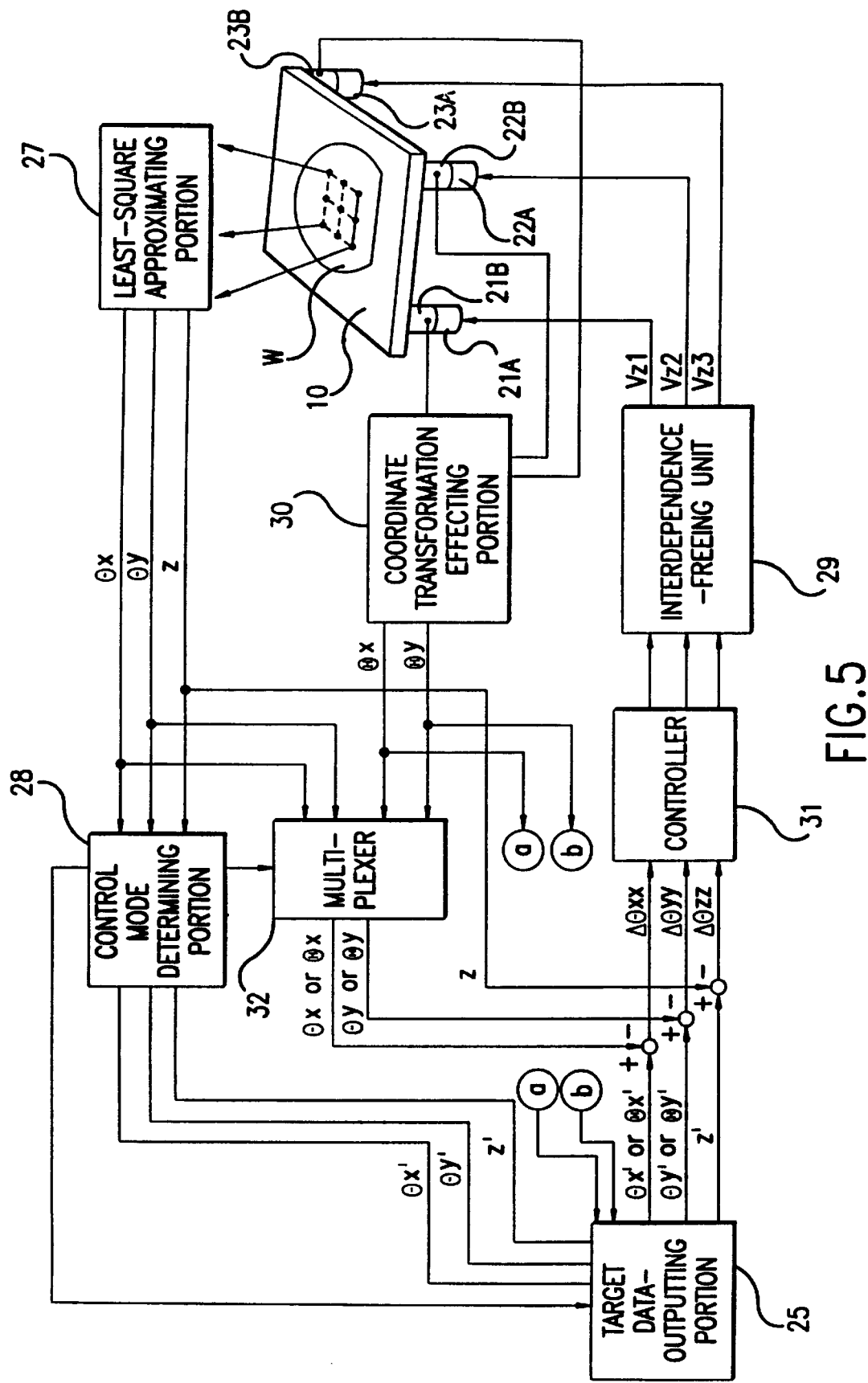
FIG. 5 is a block diagram showing a configuration of a focus controlling system.

FIG. 5 shows a configuration of a focus controlling system in this embodiment.

A target data-outputting section 25 constantly outputs a target value of the Z-directional position z', a first target value θx' for the X-directional tilt (tilt with respect to the Y-axis) and a first target value θy' for the Y-directional tilt (tilt with respect to the X-axis), to a control mode determining circuit 28. The target data-outputting section 25 outputs the target value of the Z-directional position z' and further outputs as a target value for positional control by the controller 31, the first target value θx' for the X-directional tilt (tilt with respect to the Y-axis) or a second target value Θx' as well as outputs as a target value for positional control by the controller 31, the first target value θy' for the Y-directional tilt (tilt with respect to the X-axis) or a second target value Θy'.

Here, the target value of the Z-directional position z', the first target value Θx' for the X-directional tilt (tilt with respect to the Y-axis) and the first target value θy' for the Y-directional tilt (tilt with respect to the X-axis) are primary target values for focus control and previously determined when the imaging plane of the projection optical system PL is calibrated by trial exposures or the like. The second temporary target values Θx' and Θy' are appropriate target values set up to maintain the X-directional tilt (tilt with respect to the Y-axis) and the Y-directional tilt (tilt with respect to the X-axis). In this embodiment, a tilt of the substrate table 10 with respect to Y-axis right before the changeover of the control mode is used as the second target value Θx' and a tilt of the substrate table 10 with respect to X-axis right before the chageover of the central mode is used as the second target values Θy'.

A least-square approximating circuit 27, using detection signals on Z-directional positions as to the wafer W surface detected by all the sensor elements $7_1$ to $7_n$ constituting the focus sensor 7, determines an approximating plane using the so-called least-square method and outputs the information on the approximated plane as three decomposed components: the Z-directional position z in the optical axis AX of the projection optical system PL, the X-directional tilt θx (tilt with respect to the Y-axis and the Y-directional tilt θy (tilt with respect to the X-axis).

The control mode determining circuit 28 effects determination of control modes, based on the deviation (Δθx, Δθy, Δz) or the difference between the target values z', θx' and θy' from the target data-outputting circuit 25 and the current value information z, θx and θy from the least-square approximating circuit 27. This will be described later.

The coordinate-transformation effecting circuit 30 transforms the measurements PZ1, PZ2 and PZ3 detected by the encoders 21B, 22B and 23B built in the three Z-positional drivers 21, 22 and 23 into the Z-directional position Z, the X-directional tilt Θx (tilt with respect to the Y-axis and the Y-directional tilt Θy (tilt with respect to the X-axis) in accordance with formula 1 and sends out Θx and Θy of the thus detected values to a multiplexer 32.

Adder/subtracter sections 33 determine: a Z-directional position deviation Δzz (Δz) or a difference between the target value z' from the target data-outputting circuit 25 and the current value z from the least-square approximating circuit 27; an X-directional tilt (tilt with respect to Y-axis) deviation Δθxx or a difference between the target values θx' (or Θx') and the current values θx (or θx) from the least-square approximating circuit 27; and an Y-directional tilt (tilt with respect to X-axis) deviation Δθyy or a difference between the target values θy' (or Θy') and the current values θy (or Θy) from the least-square approximating circuit 27.

The controller 31 is a controller for the positional control loop and includes a so-called ?ID controller, which uses as operation signals the Z-directional position deviation Δzz, the X-directional tilt deviation Δθxx and the Y-directional tilt deviation Δθyy, and effects the P-operation, PI-operation or PID operation. This controller 31 multiplies the deviations Δzz, Δθxx and Δθyy by respective gains to create velocity instructions which are supplied to the actuators 21A, 22A and 23A.

An interdependence freeing unit 29 is provided inside the servo loop so that three components, Z-directional component and tilt components with respect to X- and Y-axis can be independently controlled, although the limitation of the control depends on the linearity of the system. The interdependence freeing unit 29 effects interdependence freeing calculations for allotting the velocity instructions represented by the three components, that is, the components as to the tilts with respect to X- and Y-axes and the Z-directional component, to each of the actuators based on the current positions or the X-Y two-dimensional coordinates of the three Z-positional drivers and practically outputs the calculated result to the actuators 21A, 22A and 23A.

Specifically, in the controller 31, the deviations Δθxx, Δθyy and Δzz are multiplied by positional servo loop gains $K_{\theta x}$ for the X-directional tilt, $K_{\theta y}$ for the Y-directional tilt and $K_z$ for the Z-directional component, respectively to produce $K_{\theta x}\Delta\theta xx$, $K_{\theta y}\Delta\theta yy$ and $K_z\Delta zz$ as velocity instruction data to the actuators 21A, 22A and 23A. Then, the interdependence freeing unit 29, based on the velocity instruction data, effects the following calculation shown in formula 2 to create velocity instructions Vz1, Vz2 and Vz3 for respective Z-positional drivers.

$$\begin{bmatrix} Vz1 \\ Vz2 \\ Vz3 \end{bmatrix} = \begin{bmatrix} X1 & Y1 & 1 \\ X2 & Y2 & 1 \\ X3 & Y3 & 1 \end{bmatrix} \begin{bmatrix} K_{\theta x}\Delta\theta xx \\ K_{\theta y}\Delta\theta yy \\ K_z\Delta zz \end{bmatrix} \quad \text{(formula 2)}$$

where (X1, Y1), (X2, Y2) and (X3, Y3) represent the positions of respective Z-positional drivers relative to the projection optical system PL.

The multiplexer 32, in response to the instructions from the control mode determining circuit 28 effects switching operations between the current two tilt data (θx, θy) obtained from the least-square approximating section 27 and the current two tilt data (Θx, Θy) from the coordinate-transformation effecting circuit 30. That is, the multiplexer 32 is provided so as allow either the position of the wafer W surface detected by the focus sensor 7 or the position of the substrate table 10 detected by the encoders (21B to 23B) of the Z-positional drivers to be used as the data on the current position.

The three point actuators (21A to23A) each have a velocity minor-loop (current minor-loop) and use an incorporated velocity detector (tachogenerator) to effect servo-control to attain the movement specified by the given velocity instructions. Specifically, each of the Z-positional drivers 21, 22 and 23 is composed with a sub-unit controlled by the velocity loop using as a velocity sensor a tachogenerator incorporated in the actuator 21A, 22A or 23A so that the drivers move in accordance with velocity instructions given from the outside.

Figure 7:
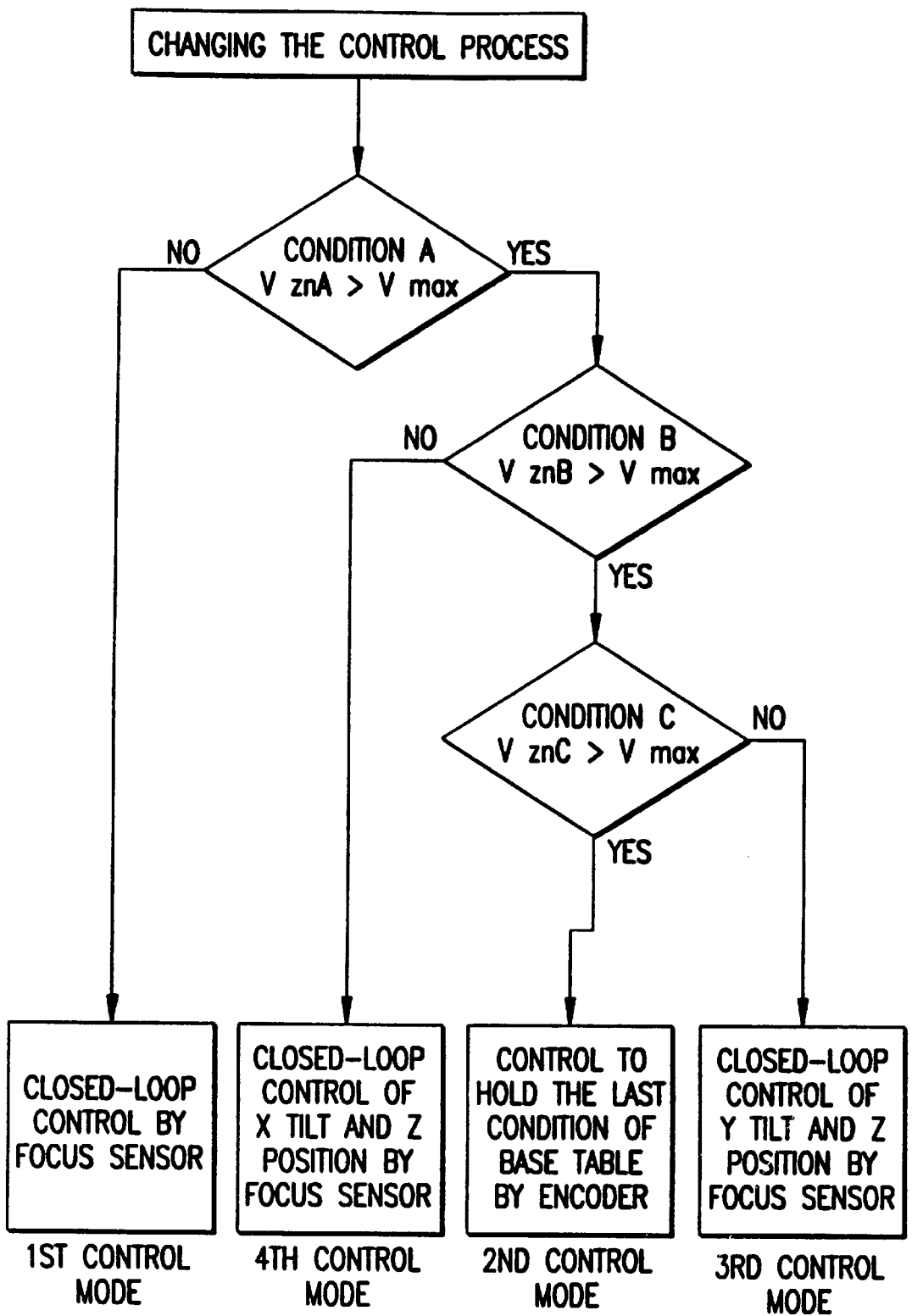
FIG. 7 is a flowchart for illustrating control steps.

Referring next to FIG. 7, detailed explanation will be made on the determination of the control mode in the control mode determining circuit 28 as well as the switching operation between the control modes therefor.

In the above formula 2, if any of the velocity instruction data Vz1, Vz2 and Vz3 exceeds the limitation value and the movement of the actuator reaches the upper limit, it is impossible to attain the movement instructed by the formula 2 or an operation free from interdependence.

Here, suppose that the maximum of the velocity instruction data is represented by Vmax. In order that the velocity instructions to the actuators in the Z-positional driver will not exceed the limit, the following condition A should be denied: Condition A:

$$VznA = K_{\theta x} \cdot \Delta\theta x \cdot Xn + K_{\theta y} \cdot \Delta\theta y \cdot Yn + K_z \cdot \Delta z$$

any of VznA (n=1, 2 or 3) defined as above exceeds Vmax.

If the condition A is false, the control mode determining circuit 28 sets up a first control mode or causes the multiplexer 27 to output θx and θy determined by the focus sensor. In this case, the target data-outputting circuit 25 outputs as the target values of the position control loop, z' and the first target values θx' and θy' for X- and Y-directional tilts.

Accordingly, in the case of the first control mode, the controller 31 is inputted with the Z-directional position deviation Δz, the X-directional tilt (tilt with respect to Y-axis) deviation Δθx and the Y-directional tilt (tilt with respect to X-axis) deviation Δθy. In other words, in the first control mode, the controller 31 receives the deviation of the current position (represented by three components: Z-directional component on the optical axis of the projection optical system and tilt components with respect to X- and Y-axes) detected by the focus sensor 7, from the target data. The controller 31 multiplies the Z-directional component and X-directional and Y-directional tilt components by respective gains to produce velocity instructions. The thus produced velocity instructions are converted in accordance with the control rule of formula 2 into velocity instructions at the positions of Z-position drivers to be given to the actuators having velocity minor-loops. The movements of the actuators are detected by the focus sensor 7 as a displacement of the wafer W surface so that closed loop control of the position is performed.

In contrast, if the condition A holds, it is judged if the following conditions B and C hold. Condition B:

$$VznB = K_{\theta x} \cdot \Delta\theta x \cdot Xn + K_z \cdot \Delta z$$

any of VznB (n=1, 2 or 3) exceeds Vmax. Condition C:

$$VznC = K_{\theta y} \cdot \Delta\theta y \cdot Yn + K_z \cdot \Delta z$$

any of VznC (n=1, 2 or 3) exceeds Vmax.

When both the conditions B and C hold, the control mode determining circuit 28 sets up a second control mode or causes the multiplexer 27 to output Θx and Θy. In this case, the target data-outputting circuit 25 outputs as the target values of the position control loop, z' and the second target values Θx' and Θy' for X-and Y-directional tilts. Accordingly, in the case of the second control mode, the controller 31 is inputted with the Z-directional position deviation Δz, the X-directional tilt (tilt with respect to Y-axis) deviation Δθx'=Θx'−Θx, and the Y-directional tilt (tilt with respect to X-axis) deviation Δθy'=Θy'−Θy. As a result, the interdependence freeing unit 29 uses the difference (Δθx'=Θx'−Θx, Δθy'=Θy'−Θy) between the position of the substrate table 10 right before the changeover of the control and the current position of the substrate table 10, in place of the difference between the target data and the current position and executes the control rule defined by formula 2. Thereby, the movements of the actuators 21A, 22A and 23A are detected by the encoders 21B, 22B and 23B as displacements of the Z-positional drivers 21, 22 and 23. The displacements detected are coordinate-converted in the coordinate transformation effecting circuit 30 into the current value of the substrate table 10 while the X-and Y-directional tilt components are fed back to the controller 31. Thus, closed loop positional control as to X-directional and Y-directional tilt components is effected so that the posture of the tilts with respect to X- and Y-axes is controlled to be kept as used to be in the posture right before the changeover between the controls, regardless of the surface condition of the wafer. As to the Z-directional component, the difference between the target value and the current value is given as the deviation so that the normal servo control is effected so as to make the current data correspond to the target data.

When both the conditions A and B hold while the condition C does not hold, the control mode determining circuit 28 sets up a third control mode. In this case the multiplexer 27 is caused to output Θx and θy. At that moment, the target data-outputting circuit 25 outputs as the target values of the position control loop, z' and the target values Θx' and θy' for X- and Y-directional tilts. Accordingly, in the case of the third control mode, the controller 31 is inputted with the Z-directional position deviation Ez, the X-directional tilt (tilt with respect to Y-axis) deviation Δθx'=Θx'−Θx, and the Y-directional tilt (tilt with respect to X-axis) deviation Δθy. As a result, the interdependence freeing unit 29 executes the control rule defined by formula 2 using as a X-directional deviation the difference between the position of the substrate table 10 right before the changeover of the control and the current position of the substrate table 10, in place of the deviation Δθx or the difference between the target data and the current position with respect to the X-component. Thereby, the X-directional tilt or the posture of the tilt with respect to the Y-axis is controlled to be kept as used to be in the posture right before the changeover between the controls, regardless of the surface condition of the wafer W. As to Y-directional tilt (tilt with respect to X-axis) as well as the Z-directional component, the difference between the target data and the current data is given as the deviation so that the normal servo control is effected so as to make the current data correspond to the target data.

When the condition A holds and the condition B does not hold (without regarding that the condition C either holds or not), the control mode determining circuit 28 sets up a forth control mode. In this case the multiplexer 27 is set up to output θx and Θy. At that moment, the target data-outputting circuit 25 outputs as the target values of the position control loop, z' and the target values θx' and Θy' for X- and Y-directional tilts. Accordingly, in the case of the fourth control mode, the controller 31 is inputted with the Z-directional position deviation Δz, the X-directional tilt (tilt with respect to Y-axis) deviation Δθx and the Y-directional tilt (tilt with respect to X-axis) deviation Δθy'=Θy'−Θy. As a result, the interdependence freeing unit 29 executes the control rule defined by formula 2 using as a Y-directional deviation the difference between the position of the substrate table 10 right before the changeover of the control and the current position of the substrate table 10, in place of the deviation Δθy or the difference between the target data and the current position with respect to the Y-component. Thereby, the Y-directional tilt or the posture of the tilt with respect to the X-axis is controlled to be kept as used to be in the posture right before the changeover between the controls, regardless of the surface condition of the wafer W. As to X-directional tilt (tilt with respect to Y-axis) as well as the Z-directional component, the difference between the target data and the current data is given as the deviation so that the normal servo control is effected so as to make the current data correspond to the target data.

The focusing control system of the invention normally operates in the first control mode and is set into any of the second through fourth control modes if the wafer W surface has irregularities or roughness over a certain level and therefore it is judged that the velocity instruction data given to the actuators of the Z-position drivers for the correction of the inclinations with respect to X- or Y-axes is beyond the limit. Also in the course of the operation in any of the second through fourth control modes, the judgment based on the conditions A, B and C will be continued so that the switching of the control mode is successively effected in accordance with the variation of the conditions. In an order of this judgment, the judgment as to the conditions B and C is made only after the judgment as to the condition A has been carried out. Thus, the operation is set into the first control mode to carry out focusing and leveling control as soon as the degree of irregularities on the wafer W surface becomes small so that the velocity instruction data falls within the limited range.

As has been apparent from the above description, in this embodiment, the focus sensor 7 and the least-square approximating circuit 27 constitute the first detecting circuit while the encoders 21B, 22B and 23B constitutes the second detecting circuit. The target value outputting circuit 25, multiplexer 32, controller 31 and interdependence freeing unit 29 constitute the control circuit.

As has been described heretofore, in accordance with this embodiment, when irregularities on the wafer W surface are relative small and controllable as to leveling in view of the apparatus performances, the system is controlled so that the wafer W surface inside the exposure field may be made correspondent with the focal plane of the projection optical system PL. Accordingly, it is possible to minimize the defocus over the whole part of the exposure field and therefore it is possible to draw the full performances of the depth of focus of the projection optical system. Further, even if the irregularities on the wafer W surface are relatively large and the apparatus performance is not enough to attain proper leveling, it is possible to effect the focusing control free from lethal defocus which could cause fatal breakdown to the control although the degradation in view of performances is unavoidable.

Even in the latter case, if it is judged by the two-stage conditional judgment that the tilt with respect to any one of the X- and Y axes is followable enough by the ability of the apparatus, the followable tilt as well as the Z-directional position can be controlled so as to follow the target data while the tile with respect to the other axis is fixed.

Although the above description of the embodiment has been made as to a case where four kinds of modes, first through fourth modes are changed over finely, the third and fourth mode are not essential and the system without third and fourth modes is considered to adequately produce practical advantages. This is because that when the wafer W surface in the exposure field are too rough to be compensated by the leveling control, a great depth of focus of the projection optical system PL is used so that the leveling control becomes ineffective and only the focus control is enough for practical operations. In this case, the operation may be switched over between the first and second control modes based only on the condition A.

The conditions A, B and C for determination of control-mode change described in the above embodiment are mere examples and should not limit the invention. For example, it is possible to construct a system in which the deviation (the difference between the target data and the current data) itself is limited so that if a great deviation above the threshold is detected after completion of a positional control under a control mode, the control mode may be changed over.

In the above embodiment, the determining conditions A, B and C are to limit the velocity, it is easier for a system using laminate type piezoelectric devices to make judgment based on the position or displacement in place of the velocity.

Further, in the above embodiment, in order to make the closed loop servo control for keeping the wafer surface at an inclined posture, the target data itself is to be changed over in accordance with the switching the control modes. This configuration, however, should not limit the invention, and any other control scheme can be used as long as it is possible for the scheme to keep the inclination with respect of one of the axes and adjust the Z-directional position and the inclination with respect to the other axis.

As has been described heretofore, in accordance with the invention, while the determining circuit 28 is making affirmative judgment, the control circuit, based on the target data from the target data-outputting circuit 25 and the calculated result from the least-square approximating circuit 27, controls the Z-tilt stage 60 so as to make the exposure field on the photosensitive substrate W surface correspond to the focal plane of the projection optical system PL. On the other hand, while the determining circuit 28 is making negative judgment, the control circuit controls the Z-tilt stage 60 so as to keep the photosensitive substrate W at a fixed inclination and make the position of the exposure field on the photosensitive substrate surface with respect to the optical-axis direction correspond to the center of the focal plane of the projection optical system, based on the target data on the center position along the optical axis direction from the target data-outputting circuit 25 and the calculated result from the coordinate-transformation effecting unit 30. Accordingly, it is possible to realize stabilized focusing operation control which presents highly followable performances for the photosensitive substrate with few irregularities and will work without failure down even if a photosensitive substrate having rough irregularities is processed, and consequently, the present invention is able to provide a remarkable improvement upon the apparatuses heretofore in use.

Further, in accordance with the invention, if only one of the tilt deviations with respect to the first and second axes falls beyond the allowable range, the control circuit changes the operation mode into the third or fourth control mode in which the Z-tilt stage 60 is controlled so that the photosensitive substrate may be kept at a fixed inclination with respect to one of the first or second axis while the position of the exposure field on the photosensitive substrate surface along the optical axis and the inclination of the substrate with respect to the other axis are adjusted based on the target data from the target data-outputting circuit 25 and the tilt quantities detected by the second detecting circuit. As a result, the apparatus of the invention lends itself to achieve fine and exact focusing and leveling control without failure.

What is claimed is:

1. A method of projection exposure for exposing a pattern formed on a mask to the surface of a photosensitive substrate by illuminating the mask to project part of the pattern image of the mask onto an exposure field of the photosensitive substrate through a projection optical system as scanning the mask and the substrate in synchronism with each other relative to the projection optical system, comprising the steps of:

producing a target position and target tilt data of the exposure field on the photosensitive substrate surface in a direction of an optical axis of the projection optical system;

detecting a position in the exposure field on the photosensitive substrate surface in the optical-axis direction of the projection optical system;

calculating a first position of the exposure field on the photosensitive substrate in the optical-axis direction and first tilt of the exposure field relative to a plane perpendicular to the optical axis, based on the detected information;

determining whether an amount based on at least one of a difference between the first position and the target position and a difference between the first tilt and the target tilt of the exposure field on the photosensitive substrate surface falls within a controllable range of the position of the photosensitive substrate; and controlling at least one of the position and the tilt of the photosensitive substrate in such a manner that if the judgment is affirmative, the exposure field on the photosensitive substrate surface is made to correspond with the focal plane of the projection optical system based on the target position and the target tilt data as well as the first position and the first tilt data, and if the judgment is negative, the position of the exposure field in the optical-axis direction is made to correspond with the center position of the focal plane of the projection optical system in the optical-axis direction based on the target position and the first position, with the photosensitive substrate surface being kept at a fixed tilt.

2. A method of projection exposure according to claim 1 further comprising the step of detecting second tilt as to the photosensitive substrate relative to a plane perpendicular to the optical-axis; wherein control is effected based on the second tilt when the determination result is changed from the affirmative to the negative.

3. A method of projection exposure according to claim 1, wherein the amount based on at least one of a difference between the first position and the target position and a difference between the first tilt and the target tilt of the exposure field on the photosensitive substrate surface is a velocity instructions for controlling at least one of the position and tilt of the photosensitive substrate.

4. A method of projection exposure for exposing a pattern formed on a mask to the surface of a photosensitive substrate placed on a substrate table by illuminating the mask to project part of the pattern image of the mask onto a predetermined exposure field of the photosensitive substrate through a projection optical system as scanning the mask and the substrate in synchronism with each other relative to the projection optical system, comprising the steps of:

producing a target position of the exposure field on the photosensitive substrate in an optical-axis direction of the projection optical system and a target tilt of the exposure field relative to a plane perpendicular to the optical axis;

detecting a first position of the exposure field on the photosensitive substrate surface in the optical-axis direction of the projection optical system and detecting a first tilt of the exposure field relative to a plane perpendicular to the optical axis;

detecting a second tilt of the substrate table relative to a plane perpendicular to the optical axis;

controlling based on the target position, the target tilt and the first position and one of the first tilt and the second tilt; and selecting either the first tilt or the second tilt based on the first position, the first tilt, the target position and the target tilt.

5. A method of projection exposure for exposing a pattern formed on a mask to the surface of a photosensitive substrate by illuminating the mask to project part of the pattern image of the mask onto an exposure field of the photosensitive substrate through a projection optical system by scanning the mask and the substrate in synchronism with each other relative to the projection optical system, comprising the steps of:

producing a target position and a target tilt of the exposure field on the photosensitive substrate surface in a direction of an optical axis of the projection optical system;

detecting a position in the exposure field on the photosensitive substrate surface in the optical-axis direction of the projection optical system;

calculating a first position of the exposure field on the photosensitive substrate in the optical-axis direction and a first tilt of the exposure field relative to a plane perpendicular to the optical axis, based on the detected information; and determining whether an amount based on at least one of a difference between the first position and the target position and a difference between the first tilt and the target tilt of the exposure field on the photosensitive substrate surface falls within a controllable range of the position of the photosensitive substrate.

6. An exposure method comprising the steps of:

exposing a substrate with a pattern formed on a mask by projecting an image of the pattern through a projection optical system onto the substrate while moving the mask and the substrate in synchronism with each other, and adjusting one of a tilt of the substrate and a position of the substrate in a direction of an optical axis of the projection optical system while fixing the other of the tilt of the substrate and the position of the substrate in the direction of the optical axis of the projection optical system during the synchronous movement of the mask and the substrate.

7. The exposure method according to claim 6, further comprising switching between a first controlling mode in which both the tilt of the substrate and the position of the substrate in the direction of the optical axis of the projection optical system are adjusted during the synchronous movement of the mask and the substrate, and a second controlling mode in which one of the tilt of the substrate and the position of the substrate in the direction of the optical axis of the projection optical system is adjusted while the other of the tilt of the substrate and the position of the substrate in the direction of the optical axis of the projection optical system is fixed during the synchronous movement of the mask and the substrate.

8. The exposure method according to claim 7, wherein the tilt of the substrate is fixed in the second controlling mode.

9. The exposure method according to claim 8, wherein the tilt includes a first tilt relative to a direction of the synchronous movement of the substrate and a second tilt relative to a direction perpendicular to the direction of the synchronous movement of the substrate.

10. The exposure method according to claim 9, wherein the tilt is adjusted in the first controlling mode by adjusting one of the first tilt and the second tilt.

11. The exposure method according to claim 10, wherein the tilt is fixed in the second controlling mode by fixing at least one of the first tilt and the second tilt.

12. The exposure method according to claim 11, wherein the tilt is fixed in the second controlling mode by fixing the second tilt.

13. The exposure method according to claim 11, wherein the tilt of the substrate is held when the first controlling mode is switched to the second controlling mode.

14. The exposure method according to claim 7, further comprising detecting a position of the substrate surface relative to an imaging plane of the projection optical system.

15. The exposure method according to claim 14, wherein the position of the substrate surface is detected by detecting positions of the substrate at a plurality of measuring points on the substrate in a direction of an optical axis of the projection optical system.

16. The exposure method according to claim 14, wherein the switching between the first controlling mode and the second controlling mode is effected based on the detected position of the substrate surface.

17. The exposure method according to claim 16, wherein the substrate is placed on a stage having three supporting points which are movable in a direction of the optical axis of the projection optical system, and the tilt and the position of the substrate are adjusted by moving the three supporting points in the direction of the optical axis of the projection optical system.

18. The exposure method according to claim 17, wherein the movements of the three supporting points are controlled based on a deviation of the detected position of the substrate surface and a target position, and matrix information.

19. The exposure method according to claim 18, wherein the matrix information includes information on positions of the three supporting points relative to the projection optical system.

20. The exposure method according to claim 18, wherein the first controlling mode is switched to the second controlling mode when at least one of movement control amounts of the three supporting points exceeds a predetermined value.

21. The exposure method according to claim 18, wherein the first controlling mode is switched to the second controlling mode when the deviation of the detected position of the substrate surface and the target position exceeds a predetermined value.

22. The exposure method according to claim 6, wherein the tilt of the substrate is fixed during the synchronous movement of the mask and the substrate.

23. The exposure method according to claim 22, wherein the tilt includes a first tilt relative to a direction of the synchronous movement of the substrate and a second tilt relative to a direction perpendicular to the direction of the synchronous movement of the substrate.

24. The exposure method according to claim 23, wherein at least one of the first tilt and the second tilt is fixed.

25. The exposure method according to claim 24, wherein the second tilt is fixed.

26. The exposure method according to claim 6, further comprising detecting a position of the substrate surface relative to an imaging plane of the projection optical system.

27. The exposure method according to claim 26, wherein the position of the substrate surface is detected by detecting positions of the substrate at a plurality of measuring points on the substrate in a direction of an optical axis of the projection optical system.

28. The exposure method according to claim 26, wherein one of the tilt of the substrate and the position of the substrate in the direction of the optical axis of the projection optical system is adjusted based on the detected position of the substrate surface.

29. The exposure method according to claim 28, wherein the substrate is placed on a stage having three supporting points each of which is movable in a direction of the optical axis of the projection optical system, and the tilt of the substrate and the position of the substrate are adjusted by moving the three supporting points, respectively.

30. The exposure method according to claim 29, wherein the three supporting points are moved based on a deviation of the detected position of the substrate surface and a target position, and matrix information.

31. The exposure method according to claim 30, wherein the matrix information includes information on positions of the three supporting points relative to the projection optical system.

32. An exposure method for exposing a substrate with a pattern formed on a mask by projecting an image of the pattern through a projection optical system onto the substrate while moving the mask and the substrate in synchronism with each other, comprising the steps of:

detecting a position of the substrate surface during the synchronous movement of the mask and the substrate; and adjusting one of a tilt of the substrate and a position of the substrate in a direction of an optical axis of the projection optical system based on a detected position of the substrate surface, and adjusting the other of the tilt of the substrate and the position of the substrate in the direction of the optical axis of the projection optical system without using the detected position of the substrate surface.

33. The exposure method according to claim 32, wherein the position of the substrate surface is detected by detecting positions of the substrate at a plurality of measuring points on the substrate in a direction of an optical axis of the projection optical system.

34. The exposure method according to claim 33, wherein the position of the substrate surface is detected by determining the tilt of the substrate and the position of the substrate in the direction of the optical axis of the projection optical system based on the detected positions at the measuring points on the substrate.

35. The exposure method according to claim 34, wherein the other of the tilt of the substrate and the position of the substrate is the tilt of the substrate.

36. The exposure method according to claim 35, wherein the tilt of the substrate includes a first tilt relative to a direction of the synchronous movement of the substrate and a second tilt relative to a direction perpendicular to the direction of the synchronous movement of the substrate.

37. The exposure method according to claim 36, wherein the tilt of the substrate is adjusted by adjusting at least one of the first tilt and the second tilt regardless of the detected position of the substrate surface.

38. The exposure method according to claim 37, wherein the at least one of the first tilt and the second tilt is fixed.

39. The exposure method according to claim 32, further comprising switching between a first controlling mode in which both the tilt of the substrate and the position of the substrate in the direction of the optical axis of the projection optical system are adjusted based on the detected position of the substrate surface during the synchronous movement of the mask and the substrate, and a second controlling mode in which one of the tilt of the substrate and the position of the substrate in the direction of the optical axis of the projection optical system is adjusted based on the detected position of the substrate surface and the other of the tilt of the substrate and the position of the substrate is adjusted without using the detected position of the substrate surface during the synchronous movement of the mask and the substrate.

* * * * *